US008731505B2

(12) United States Patent
Leme et al.

(10) Patent No.: US 8,731,505 B2
(45) Date of Patent: *May 20, 2014

(54) PROGRAMMABLE IF OUTPUT RECEIVER, AND APPLICATIONS THEREOF

(71) Applicant: Synopsys, Inc., Mountain View, CA (US)

(72) Inventors: Carlos Azeredo Leme, Lisbon (PT); Ricardo Reis, Turcifal (PT)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/944,730

(22) Filed: Jul. 17, 2013

(65) Prior Publication Data

US 2013/0300938 A1 Nov. 14, 2013

Related U.S. Application Data

(63) Continuation of application No. 12/608,863, filed on Oct. 29, 2009, now Pat. No. 8,515,371.

(60) Provisional application No. 61/110,198, filed on Oct. 31, 2008.

(51) Int. Cl.
*H04B 1/26* (2006.01)

(52) U.S. Cl.
USPC .......... 455/314

(58) Field of Classification Search
USPC .......... 455/130, 131, 188.1, 189.1, 190.1, 455/193.1, 193.2, 193.3, 313, 314, 323, 455/333; 375/343, 350
See application file for complete search history.

(56) References Cited

U.S. PATENT DOCUMENTS 7,197,091 B1 3/2007 Petrov et al.
7,227,912 B2 6/2007 Kasperkovitz (Continued)

FOREIGN PATENT DOCUMENTS

CN 1547800 A 11/2004
KR 10-2008-0034238 A 4/2008

(Continued)

OTHER PUBLICATIONS

European Extended Search Report, European Application No. 09824142.5, Jun. 18, 2012, 7 pages.

(Continued)

*Primary Examiner* — Thanh Le
(74) *Attorney, Agent, or Firm* — Fenwick & West LLP

(57) ABSTRACT

A tuner system for receiving a plurality of frequency bands includes a low noise amplifier coupled with a band selection filter to select a desired band. The tuner system further includes a complex RF filter to produce a complex RF signal from the selected band. The tuner system includes two double-quadrature converters, the first double-quadrature converter frequency down-converts the complex RF signal to a complex baseband signal. The complex baseband signal passes through a baseband filter that contains two identical lowpass filters for obtaining a baseband in-phase (I) signal and a quadrature (Q) signal. The second double-quadrature converter up-converts the baseband I and Q signals to respective IF I and Q signals that are significantly free of the positive third IF harmonic. The third IF-harmonic free I and Q signals are further processed by a complex bandpass filter. The bandpass filter has a programmable frequency center and a programmable bandwidth.

20 Claims, 10 Drawing Sheets

(56) References Cited

U.S. PATENT DOCUMENTS

| | | | | |
|---|---|---|---|---|
| 8,285,240 | B2 * | 10/2012 | Seendripu et al. | 455/317 |
| 2004/0248535 | A1 | 12/2004 | Kasperkovitz | |
| 2005/0094750 | A1 | 5/2005 | Park et al. | |
| 2006/0281429 | A1 | 12/2006 | Kishi et al. | |
| 2007/0132889 | A1 | 6/2007 | Pan | |
| 2007/0218850 | A1 * | 9/2007 | Pan | 455/189.1 |
| 2009/0058475 | A1 | 3/2009 | Jung | |

FOREIGN PATENT DOCUMENTS

| | | | |
|---|---|---|---|
| WO | WO 02/093732 | A2 | 11/2002 |
| WO | WO 03/028206 | A1 | 4/2003 |

OTHER PUBLICATIONS

PCT International Search Report and Written Opinion, PCT Application No. PCT/US2009/062628, May 18, 2010, 10 pages.

Chinese Office Action, Chinese Application No. 200980153766.0, Apr. 3, 2013, 9 pages.

United States Office Action, U.S. Appl. No. 12/608,863, Dec. 19, 2012, 6 pages.

United States Office Action, U.S. Appl. No. 12/608,863, Feb. 17, 2012, 8 pages.

* cited by examiner

LO2I LO2Q

IF PLL

252

PROGRAMMABLE IF OUTPUT RECEIVER, AND APPLICATIONS THEREOF

CROSS-REFERENCES TO RELATED APPLICATIONS

This application is a continuation of co-pending U.S. patent application Ser. No. 12/608,863 filed on Oct. 29, 2009 and entitled "Programmable IF Output Receiver, and Applications Thereof", which claims priority to U.S. provisional application No. 61/110,198, filed Oct. 31, 2008 and entitled "Programmable IF Output Receiver, and Applications Thereof," which are incorporated by reference in their entirety.

BACKGROUND OF THE INVENTION

The present invention generally relates to television broadcasting systems. More particular, the present invention relates to RF receivers for radio frequency (RF) reception in a variety of tuner systems such as digital and analog TV tuners, video recorders, analog and digital set top boxes, and cable modems.

TV broadcasting systems and broadband cable systems enable consumers to view a large number of TV channels. In North America, program channels are assigned in radio frequency bands from 42 to 890 MHz, each channel has a bandwidth of 6 MHz. Generally, a terrestrial TV channel is spaced at either 6 MHz or 8 MHz in most parts of the world. Some TV channels are also used in cable modem systems for downstream transmission.

In North America, TV channels are grouped into bands. For example, channels 2 through 6 are grouped in VHF-low band (a.k.a band I in Europe), channels 7 through 13 in VHF-high band (band III), and channels 14 through 69 in UHF band (bands IV and V).

Numerous architectures for RF receivers have been published and are in commercial use. The superheterodyne architecture provides high channel selectivity, and hence is the most commonly used architecture for many decades in radio and TV. The superheterodyne uses a double-conversion scheme that has image frequency problems. In order to reject the image frequency in the receiver, surface acoustic wave (SAW) filters are connected to a low noise amplifier (LNA) output to let through the wanted frequency bands and block out their image frequency. The thus image-free RF bands are mixed with a local oscillator to an intermediate frequency (IF). This IF signal is further filtered by a second bandpass filter, which is usually either a SAW filter or a ceramic resonator. This filtered IF signal is finally down-converted to the baseband signal with a second mixer and a second local oscillator (LO) running at the IF frequency.

TV tuners are wideband receivers. Their bands span from 40 MHz to 800 MHz, a frequency variation of 20× from the low VHF band to the high UHF band. In contrast, most cell phone devices are narrowband receivers. For example, the GSM cellular system has a receive frequency band ranging from 925 MHz to 960 MHz, a variation of about 3% from the frequency center. As a consequence, narrowband receivers can use simple mixers (e.g., direct conversion) where the local oscillator is tuned to the same frequency as the desired RF channel; and the local oscillator (LO) frequency can even have square waveforms. However, a square waveform contains harmonics having large magnitude, especially the third and fifth harmonics of the LO frequency.

Direct conversion architectures have been intensively investigated. By eliminating the need of an IF stage, the direct conversion implementations can reduce the component counts associated with the receiver.

However, due to legacy reasons, TV demodulators operate at an intermediate frequency ranging from 30 to 60 MHz instead of at a DC level. For example, the two standard IF frequencies are 36 MHz and 44 MHz. Because of that, a direct conversion tuning device requires a second mixer stage for up-converting the DC channel to an IF output signal. Ideally, the second mixer stage should be able to preserve the image rejection properties achieved by the first mixer without requiring external components.

Image problems can be resolved by two commonly used image rejection architectures: the Hartley architecture and the Weaver architecture. The Hartley architecture has a major drawback: it is sensitive to I-Q mismatches. The image is only partially canceled with gain and phase imbalance. The change of parameters R and C due to process and temperature variation is one of the sources of I-Q mismatch.

FIG. 1 is a simplified schematic diagram of the Hartley architecture. An RF input coupled to an antenna or a cable (not shown) receives an RF signal which is amplified in the low 30 noise amplifier LNA. The amplified RF signal at the output of the LNA is then applied to mixers 110 and 130 and frequency down-converted into an in-phase signal I and a quadrature signal Q, which are further amplified by amplifiers 112 and 132. A DC offset cancelation block DCOC removes any do components of the amplified I and Q signals. DC-free I and Q signals are then filtered by lowpass filters 114 and 134, Baseband signals 116 and 136 arc further amplified by voltage gain control (VGC) amplifiers 118 and 138.

Amplified baseband signals 120 and 140 are applied to a Hartley image-rejection block 170. Hartley image-rejection block 170 includes an RC element 172 and a CR element 182 that together have the effect of shifting signal 120 by 90 degrees in relation with signal 140. Signals 174 and 184 are added in an adder 190 to produce a desired channel 192. Desired channel 192 can further be lowpass filtered by a lowpass filter 194 and is outputted to a baseband processor (not shown) for further processing.

It can be seen that the sum of signals 174 and 184 results in cancellation of the image and leaves only the desired channel. However, the Hartley image-rejection block 170 is sensitive to mismatches. If the gain and phase of the paths for signals 174 and 184 are not perfectly matched, the image is then only partially cancelled. Sources of mismatches include the amplitude and phase error at the outputs (i.e., the sine and cosine waveforms) and the inaccuracy of R and C parameters due to process and temperature variation.

Accordingly, it is the objective of this invention to provide a technical solution to the problems described above, and that this solution can be integrated into a tuner system by using standard CMOS, BiCMOS, or any other integrated circuit processes.

BRIEF SUMMARY OF THE INVENTION

Embodiments of the present invention provide a tunable receiver device whose IF output frequencies can be zero-IF or any frequencies which are selectable by programming an IF PLL and a bandpass filter. The bandpass filter is a polyphase filter that can be configured as two individual analog lowpass filters or as a complex bandpass filter. The bandwidth, gain, and center frequency of the bandpass filter are programmable.

Embodiments of the present invention provide a tuner system whose nearest aliasing band is in the fifth harmonic of the IF frequency, instead of the third harmonic as in the conventional Weaver architecture.

Embodiments of the present invention effectively remove the IF harmonics using a first order polyphase filter, according to an embodiment of the invention.

Embodiments of the present invention provide a tuner system that has a high image rejection ratio and includes a double-quadrature down-converter, a double-quadrature up-converter, and polyphase filters that can be integrated together in a single integrated circuit, whereby parasitic tuning of harmonics can be minimized, in accordance with an embodiment of the invention.

Embodiments of the present invention provide an active R-C polyphase filter that has programmable center frequency and programmable bandwidth.

In an embodiment of the present invention, a tuner system for radio frequency reception includes a low noise amplifier that provides both amplification and some rejection of odd harmonics of a desired channel. The tuner system may include a band selection filter for selecting one of the multiple bands. The tuner system also includes a complex RF filter that removes negative frequencies of the selected band. The tuner system includes a double-quadrature down-converter having four high frequency (HF) multipliers that mix the selected band with two orthogonal oscillation frequencies and produces an in-phase baseband signal and a quadrature baseband signal. In an embodiment, the in-phase and quadrature baseband signals are applied to a baseband filter that amplifies the desired channel signals and removes adjacent channel signals. The baseband filter may have a programmable bandwidth to accommodate different TV systems or TV bands having, for example, 6, 7, or 8 MHz channel spacing. The tuner system further includes a double-quadrature up-converter having four intermediate frequency (IF) multipliers that up-convert the in-phase and quadrature signals into an IF in-phase and an IF quadrature signals. The IF in-phase and quadrature signals are significantly free of a positive third IF harmonic so that a subsequent first-order bandpass filter can be used.

In another embodiment of the present invention, a method of processing an RF signal in a wideband RF receiver includes selecting a band from multiple received frequency bands, generating a complex RF signal from the selected band, and down-shifting the complex RF signal to a complex baseband signal. By processing the RF signal in the complex domain, negative frequencies can be removed. The method further includes lowpass filtering the complex baseband signal, frequency up-shifting the filtered complex baseband signal for obtaining an complex IF signal, and bandpass filtering the complex IF signal.

According to the method disclosed herein, the frequency up-shifting is performing using a double quadrature up-converter for obtaining an IF signal that is significantly free of a positive third IF harmonic so that the subsequent bandpass filtering can be a first-order filter.

BRIEF DESCRIPTION OF THE DRAWINGS

The present invention is described with reference to the accompanying drawings, in which.

DETAILED DESCRIPTION OF THE INVENTION

Figure 1:
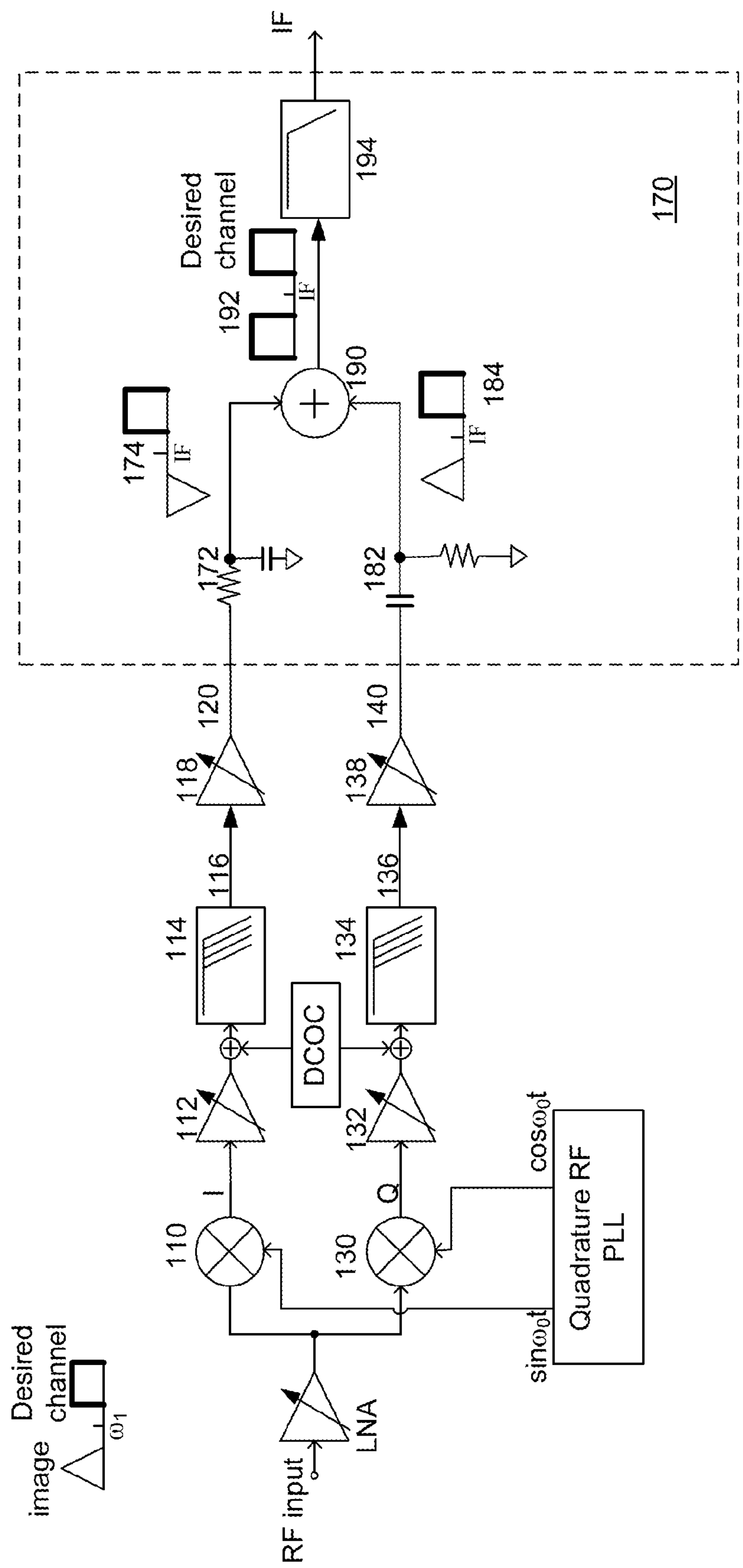
FIG. 1 is a simplified block diagram of a conventional RF receiver including a Hartley image-rejection block.
Figure 2:
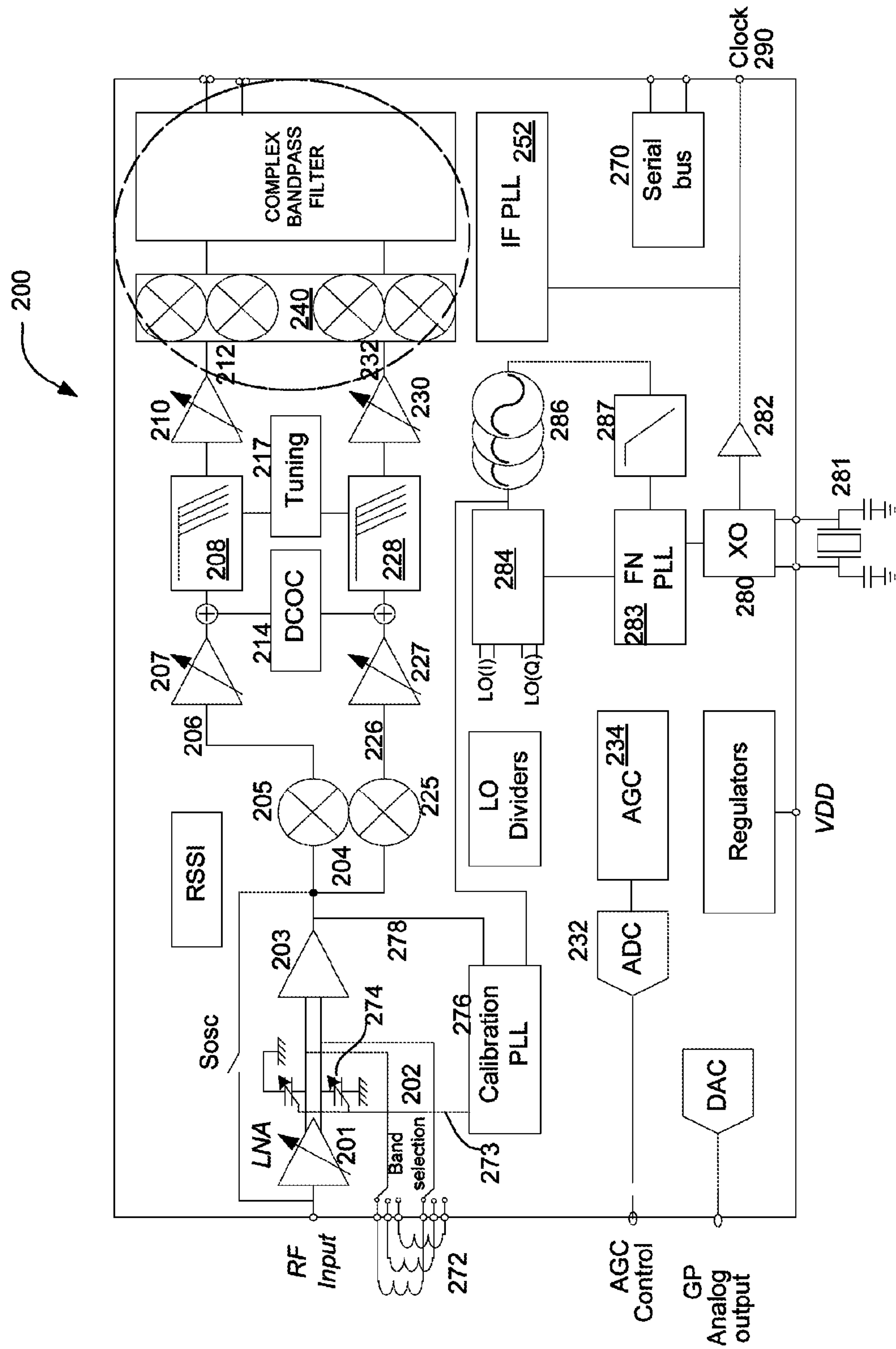
FIG. 2 is a block diagram of a tuner system according to an embodiment of the present invention.

FIG. 2 is a block diagram of a tuner system 200 according to an embodiment of the present invention. LNA 201 is capable of operating in the range of 42 to 890 MHz, i.e., covering all the TV bands. The gain of LNA 201 can be controlled through a DC voltage or a digital control source. In one embodiment, the gain of LNA 201 is switched by an external automatic gain control AGC signal. The external AGC control signal is applied to an analog-to-digital conversion block 232 that generates digital signals to an AGC block 234. AGC block 234 digitally switches the LNA's gain. It is critical that LNA 201 is designed to have a very low noise figure (e.g., NF=3.5 dB at maximum gain) and very high IIP2 and IIP3 intercept points (e.g., IIP3=−2.5 d B) to minimize distortion. In an embodiment, LNA 201 is a low noise amplifier including an one-stage tracking filter. A band selection filter 202 is coupled to LNA's output to select a desired band. In an embodiment, band selection filter 202 may have three filters divided into VHF band III (176-245 MHz), UHF band IV and V (470-870 MHz), and L-band (1.452-1.675 GHz). Band selection filter 202 will be described later. Tuner system 200 may also support DVS-H, T-DMB, and [SDB-T systems.

An amplifier 203 can further be coupled to LNA 201 to amplify the selected band. Amplified band 204 is applied to a down-converter which includes a mixer 205 and a mixer 225. In an embodiment, mixer 205 is coupled to LO(I) and mixer 225 is coupled to LO(Q). LO(I) and LO(Q) are down-conversion frequencies and have a 90 degree phase shift. In an embodiment, LNA 101 and the down-converter have high dynamic range to handle the broad frequency ranges of the TV bands (VHF low and high bands, the UHF and L-bands).

In an embodiment, mixers 205 and 225 of the down-converter are differential Gilbert cells, and oscillation frequencies LO(I) and LO(Q) arc derived from a fractional N phase locked loop (PLL) 283. Fractional N PLL 283 receives a reference frequency from a crystal oscillator X0 280, which is coupled to an external crystal 281 and a buffer 282 to provide a system clock 290. System clock 290 may be used as a reference clock for an IF PLL 252. IF PLL 252 will be described in detail later sections. In an embodiment, PLL 283 is a fractional N PLL including a lowpass filter 287, a VCO 286, and a programmable divider 284, which provides the LO(I) and LO(Q) frequencies for mixers 205 and 225.

Tuner system 200 also includes amplifiers 207 and 227 with programmable gain that couple down-converter signals 206 and 226 with baseband filters 208 and 228. A DC offset cancellation (DCOC) block 214 can use a feedback mechanism to compensate for the common-mode voltage shift occurring at outputs 212 and 232. DCOC can be realized using multiple techniques. In one embodiment, DCOC block 214 uses a large time-constant to extract the DC component at outputs 212 or 232. This DC value is then subtracted from inputs to form a closed loop system, thus reducing the output DC offset.

Filters 208 and 228 have programmable bandwidth to accommodate different TV systems. In an embodiment, the cut-off frequency of filters 208 and 228 can be set as an exemplary frequency of 6, 7, 8 MHz. In another embodiment, the cut-off frequency of filters 208 and 228 can be set below 4 MHz or above 8 MHz, and can be programmed in steps of hundreds of kHz to cover a range from 3.5 MHz to 8.5 MHz.

Tuner system 200 further includes a serial digital bus interface 270 that communicates with an external baseband processor or a microprocessor (not shown). Serial bus interface 270 also contains digital storage elements for controlling and configuring diverse elements of tuner system 200. For example, serial bus 270 includes a set of configuration registers and a set of control registers to be used to set gains of automatic gain controlled amplifiers 207, 227 and 210, 230, and to program oscillation frequencies of fractional N PLL 283 described above.

Tuner system 200 also includes low voltage dropout regulators 238 that produces several regulated voltages to noise sensitive blocks such as on-chip VCO, LNA, and others for achieving a good power supply rejection ratio.

Figure 3:
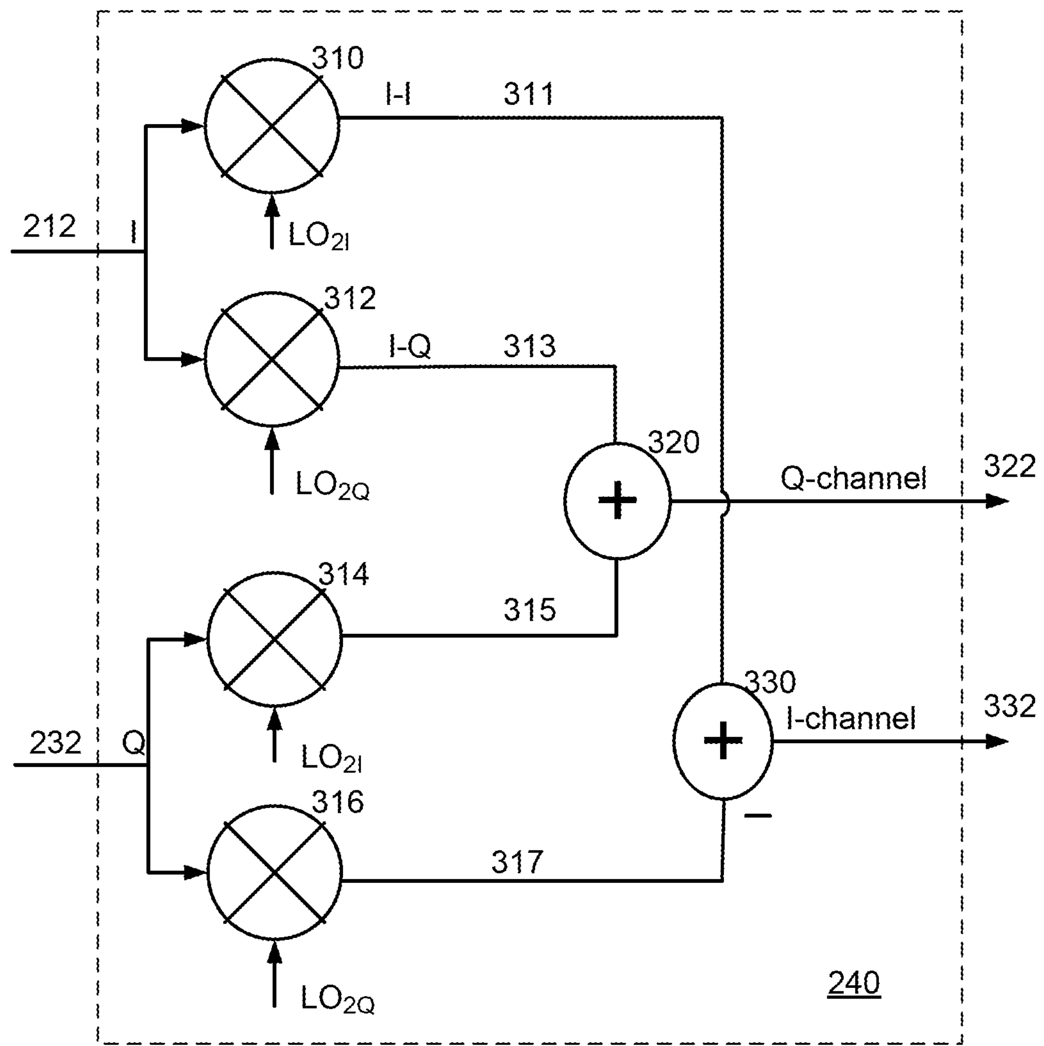
FIG. 3 is a block circuit diagram of a tuner system including a double-quadrature up-converter according to an embodiment of the present invention.

FIG. 3 shows an embodiment of double-quadrature up-converter 240. Double quadrature up-converter 240 includes multipliers 310, 312, 314, and 316. Mixer 310 has a first terminal coupled to signal 212 and a second terminal coupled to a local oscillator frequency LO-21. Mixer 312 has a third terminal coupled to signal 212 and a fourth terminal coupled to a local oscillator frequency LO-2Q. Multiplier 314 has a fifth terminal coupled to signal 232 and a sixth terminal coupled to local oscillator frequency LO-21. Multiplier 316 has a seventh terminal coupled to signal 212 and an eighth terminal coupled to local oscillator frequency LO-21. Double-quadrature up-converter 240 also includes an adder 320 that sums outputs 313 and 315 of respective Multipliers 312 and 314 and produces an IF Q-channel signal 322. Likewise, an IF I-channel signal 332 is obtained by adding (subtracting) outputs 31 I and 317 at an adder 330. In an embodiment, IF I- and Q-channel signals are differential signals. The IF-I- and Q-channels signals are significantly free of a positive IF third harmonic. Local oscillator frequencies LO-21 and LO-2Q are generated by an IF PLL 252 and have a 90 degree phase shift.

IF PLL 252 can be of a conventional design known to one of ordinary skill in the field. For example, IF PLL 252 may be an integer phase-locked loop (PLL) or a fractional-N PLL. In the case of a fractional-N PLL, a reference frequency higher than the fractional value can be used. A divider in the feedback loop (not shown) may consist of a dual-modulus divide-by-N and divide-by-(N+1) integer divider. The IF PLL output frequency can be programmed by multiplying the reference frequency Fref by a fractional number (N+F/M) where N, F and M are integer. Integer N, F and M are stored in configuration registers, which are accessed (read from and written to) through serial bus interface 270.

Figure 4:
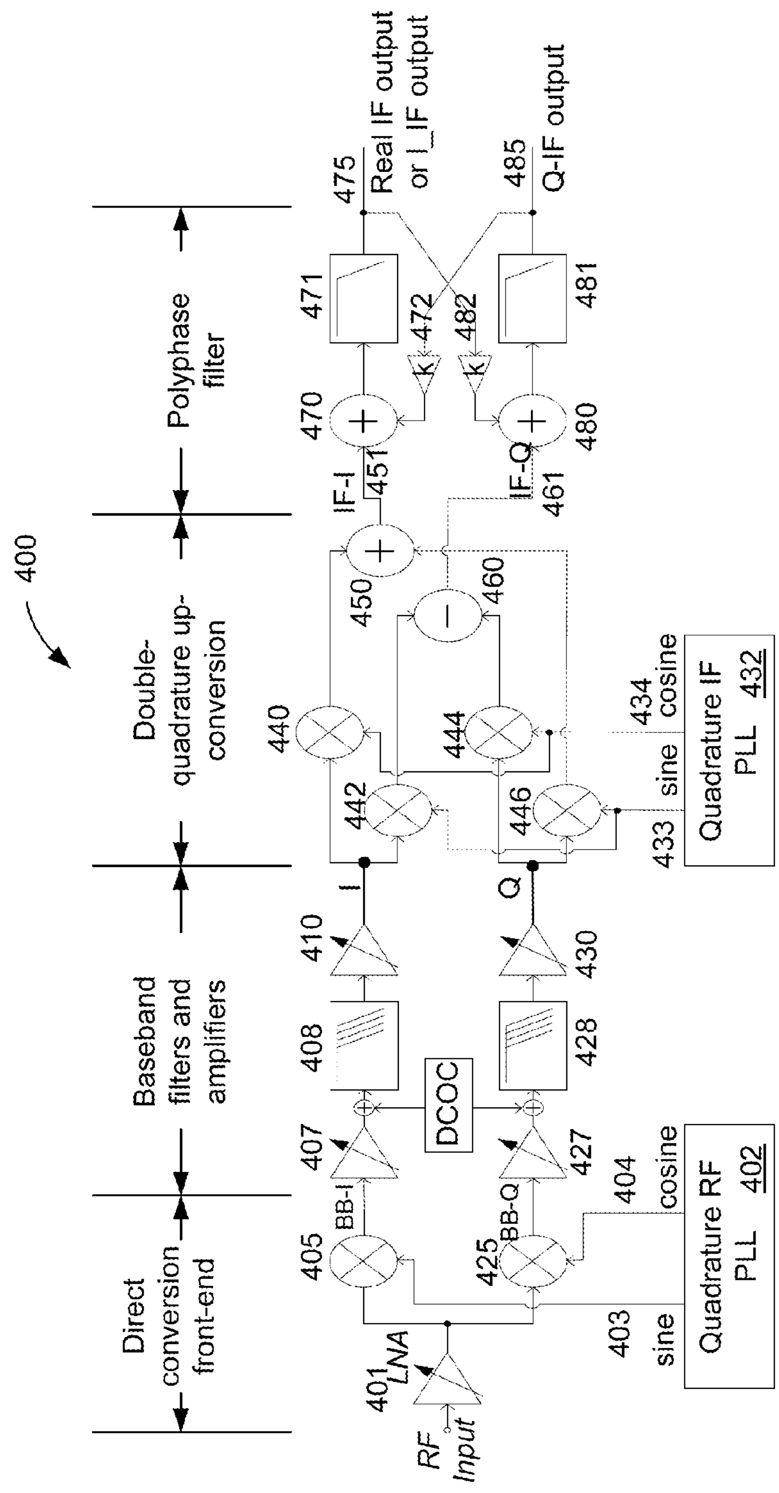
FIG. 4 is a block circuit diagram of a tuner system including a double-quadrature up-converter and a polyphase filter according to an embodiment of the present invention.

FIG. 4 is a block circuit diagram of tuner system 400, which provides more detail of an up-converter and a polyphase filter while other circuit components of FIG. 2 are omitted. Tuner system 400 contains four parts. The first part is a direct conversion front-end stage that converts an incoming RF signal to baseband signals. The direct conversion front-end is a conventional zero-IF down-conversion including low noise amplifier LNA 401. LNA 401 amplifies an RF input signal. The direct conversion front-end also includes HF multipliers 405 and 425 that down-converts the RF signal into a baseband I signal BB-I and a baseband quadrature signal 13B-Q.

The second stage comprises baseband filters and amplifiers. Signals BB-I and BB-Q are then amplified by programmable gain amplifiers 407 and 427. Lowpass filters 408 and 414 pass the wanted baseband signals, which are further amplified by programmable gain amplifiers 410 and 430. DC offset cancellation DCOC may be realized in many ways as known to one of skill in the arts. For example, DCOC may use a large time-constant to extract the DC component at output signal I and/or output signal Q. This DC value is then subtracted from inputs of filters 408 and 414 to form a closed loop system, thus reducing the output DC offset. Down-converted signals I and Q are then applied to a third stage.

The third stage includes a double-quadrature up-converter, whose function is described above in relation with FIG. 3. Basically, the double-quadrature up-converter operates in the complex domain, i.e., it up-converts signals I and Q to signals IF-I and IF-Q that are located at an intermediate frequency (IF) while eliminating a positive third harmonic of the IF frequency. The IF frequency is determined by a quadrature IF PLL 432 that is programmable through serial bus 270, IF PLL 432 produces a sine (in-phase) waveform and a cosine (quadrature) waveform to respective mixers 440, 442, 446, and 444. In an embodiment, the in-phase and quadrature waveforms may have digital logic state, i.e., logic high and logic low.

The fourth stage IF signals IF-I 451 and IF-Q 461 are applied to a polyphase filter that can be programmed to be a real lowpass filter or a complex bandpass filter. The polyphase filter includes filter elements 471 and 481 that can be active R-C first-order lowpass filters. In one embodiment, active R-C lowpass filters 471 and 481 have the same frequency response characterized by $s/j\omega_o$, where $\omega_o$ is the lowpass cutoff frequency. In general, a bandpass filter can be obtained from a lowpass filter through a frequency transformation by replacing $s/j\omega_o$ with $(s/j\omega_o+j\omega_o/s)$. In an embodiment, the active lowpass filters 471 and 481 are cross-coupled by having an output 475 of filter 471 coupled to an input of filter 481 through an element 482, and an output 485 of filter 481 coupled to input of filter 471 through an element 472. If elements 472 and 482 have infinite impedance, i.e., the cross-coupling paths are open, then filters 471 and 481 behave as two individual real lowpass filters. In that case, a real IF output signal can be obtained at output 475. However, if elements 472 and 482 have finite impedance, the active filters 471 and 481 behave as a complex bandpass filter. In this case, outputs 475 and 485 will have a respective I_IF signal 475 and a Q-IF signal 485.

Figure 5:
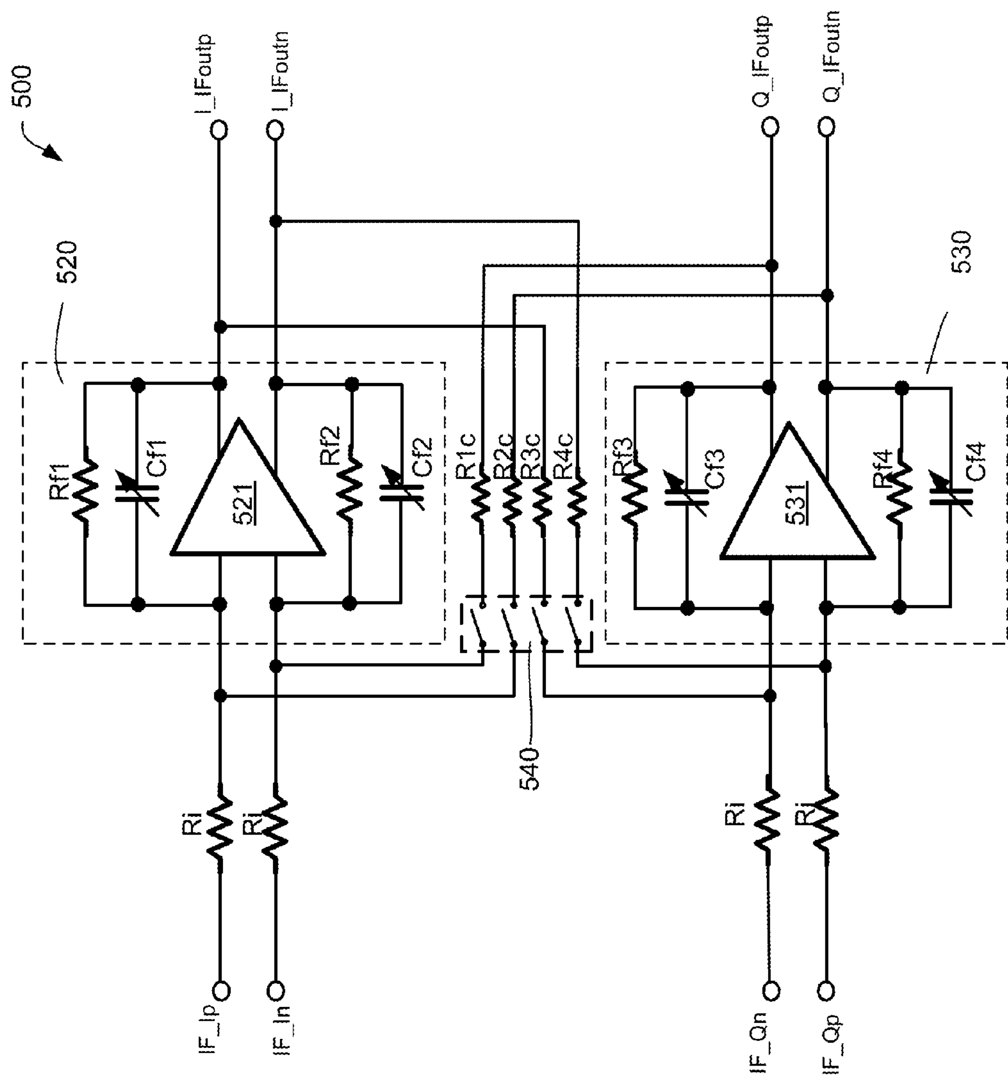
FIG. 5 is an exemplary circuit diagram of a polyphase filter according to an embodiment of the present invention.

FIG. 5 is an exemplary circuit diagram of a polyphase filter according to an embodiment of the present invention. Polyphase filter 500 includes filters 520 and 530 that can be cross-connected through a switch 540. If switch 540 is open, filters 520 and 530 are two active R-C first-order lowpass filters having a cutoff frequency determined by components Rf and Cf By selecting all Rf components having the same value and all Cf have the same value, lowpass filters 520 and 530 are symmetrical. In an embodiment, the input and output of lowpass filters 520 and 530 are differential signals. In this case, outputs I_IFoutp and l_IFoutn are then the real IF output signal. If switch 540 is closed, then lowpass filters 520 and 530 are cross-coupled and form a complex bandpass filter.

Bandpass filter 500 includes a center frequency and a frequency bandwidth. The frequency bandwidth is determined by the value of Rf and Cf In an embodiment, all R and C elements can be implemented on an integrated circuit and have programmable value. The value of Rf and/or Cf can be set through an associated configuration register that is read- and writable via serial bus interface 270. Switch 540 can be implemented using PMOS, NMOS transistors or transfer gates in a CMOS process. In an embodiment, higher order lowpass filter and bandpass filters can be obtained by cascading multiple polyphase filters 500.

In an embodiment, Rf resistors of the active RC filter may be implemented as the transconductance gm whose value can be controlled by an analog voltage. In another embodiment, Rf can be implemented as discrete resistors and their value is programmable by using electronic switches. Electronic switches can be controlled through serial bus interface 270 (FIG. 2). Similarly, capacitors Cf can be implemented as multiple discrete capacitors switched in parallel so that their values can be programmed through digital control signals. Digital control signals can be inputted through serial bus interface 270 and stored in corresponding filter configuration registers. Thus, the cutoff frequency of the active lowpass filter can be modified by varying the values of Rf and Cf Likewise, the value of cross-coupled resistors Rxc (where x is 1, 2, 3, and 4 in FIG. 5) can be implemented the same way as the feedback resistors Rf or using other methods known to people of skill in the art. The value of cross-coupled resistors Rxc can also be digitally programmable by digital control signals stored in associated IF control registers whose content is accessible through serial bus 270. By changing the value of the cross-coupled resistors, the IF frequency of the filter can be shifted. Similarly, the gain of the filter can also be programmed by changing the ratio of Rf and input resistance Ri. The value of input resistance Ri can be digitally programmed through the associate filter gain control registers.

Figure 6:
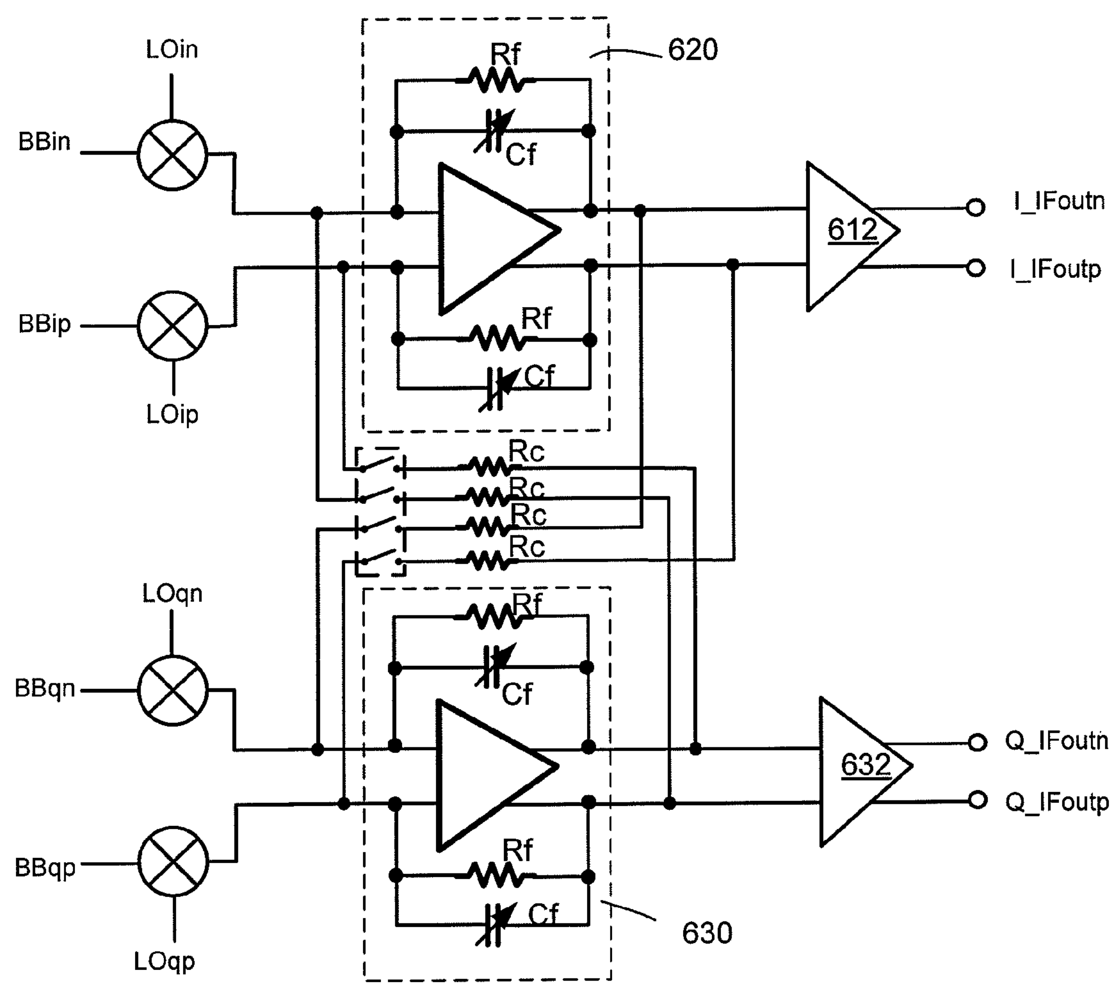
FIG. 6 is a block circuit diagram of a double-quadrature up-converter coupled to a polyphase filter according to an embodiment of the present invention.

FIG. 6 is a block circuit diagram of a double-quadrature up-converter mixer coupled to a polyphase filter according to an embodiment of the present invention. Polyphase filters have been described in detail above. A buffer 612 is inserted after filter 620. For symmetrical reason, a buffer 632 may also be added after filter 630. Buffers 612 and 632 may serve as isolation and impedance matching for a following analog-to-digital circuit (not shown). The following sections will describe the double-quadrature up-converter circuit 610 in detail.

Figure 7:
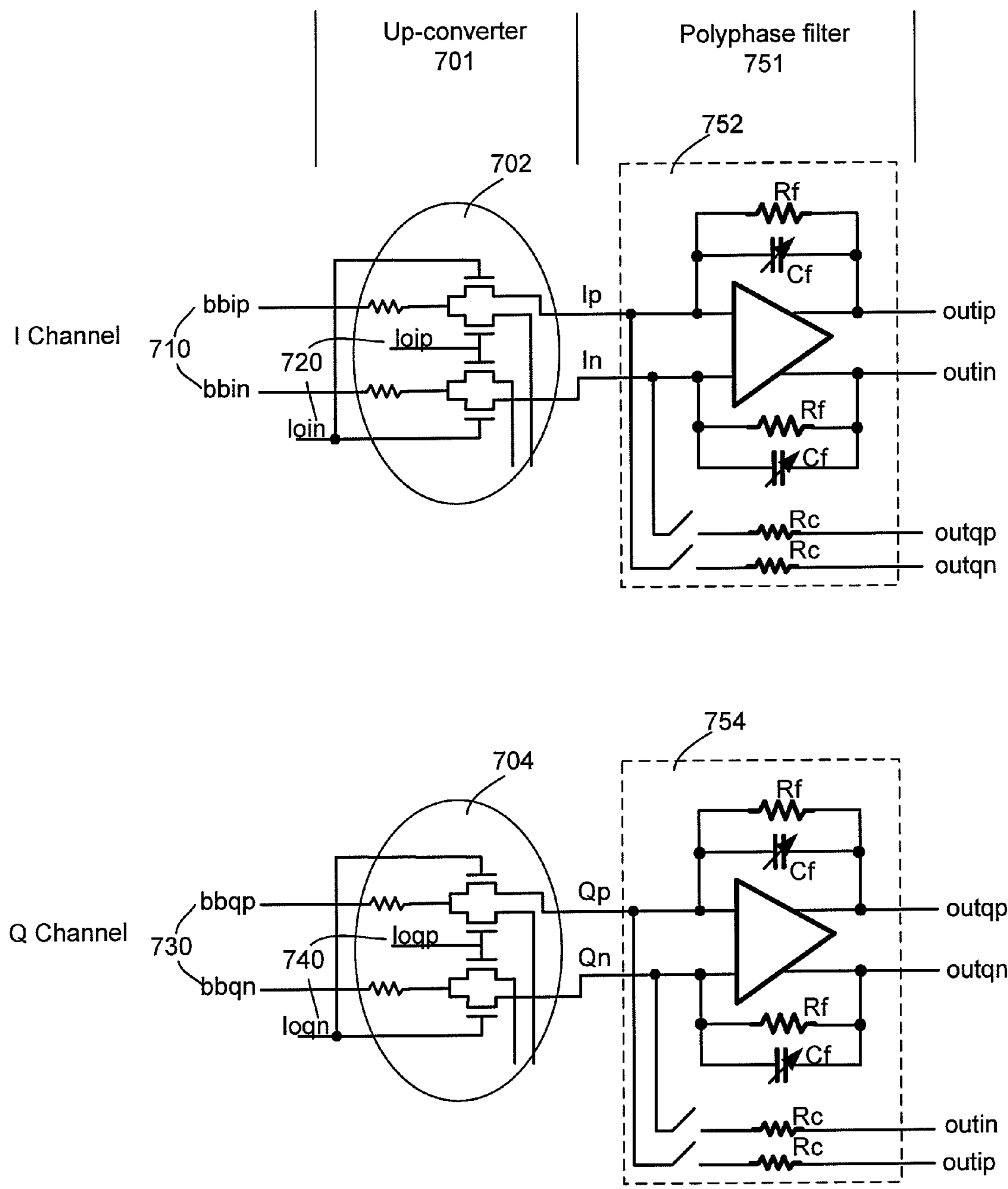
FIG. 7 is a circuit diagram of a double-quadrature up-converter mixer circuit coupled to a polyphase filter according to an embodiment of the present invention.

FIG. 7 is a circuit diagram of a double-quadrature up-converter 701 coupled to a polyphase 751 according to an embodiment of the present invention. Double-quadrature up-converter 701 includes an active switching mixer 702 having a first differential input terminal for receiving baseband signals bbip and bbin 710 and a second differential input terminal for receiving local oscillator frequencies loin and loip 720. Switching mixer 702 is realized as the interconnection of a pair of balance mixers to reject any images that are to close to the baseband signals bbip and bbin. Local oscillator frequencies loin and loip 720 are supplied an intermediate frequency PLL and are applied to the gate of FET transistors while the baseband signals bbip and bbin are applied to the drain of the FET transistors. Switching mixer 702Mixer 702 produces differential output signals Ip and In that are applied to a first portion of a polyphase filter 752. Similarly, differential quadrature signals bbqp and bbqn 730 are applied to an active switching mixer 704 that have a differential local oscillator frequency pair loqp and loran 740 coupled to the gate of its FET transistors. Mixer 704 is realized as the interconnection of a pair of balance mixers to reject any images that are to close to the baseband signals bbqp and bbqn 730. Mixer 704 produces a differential signal pair Qp and Qn.

Polyphase filter 751 includes first-order active R-C filters 752 and 754 that are cross coupled through resistors Rc. The cross-coupling (not shown in FIG. 7) is described in previous sections and a simplified configuration is shown in FIG. 5.

Figure 8:
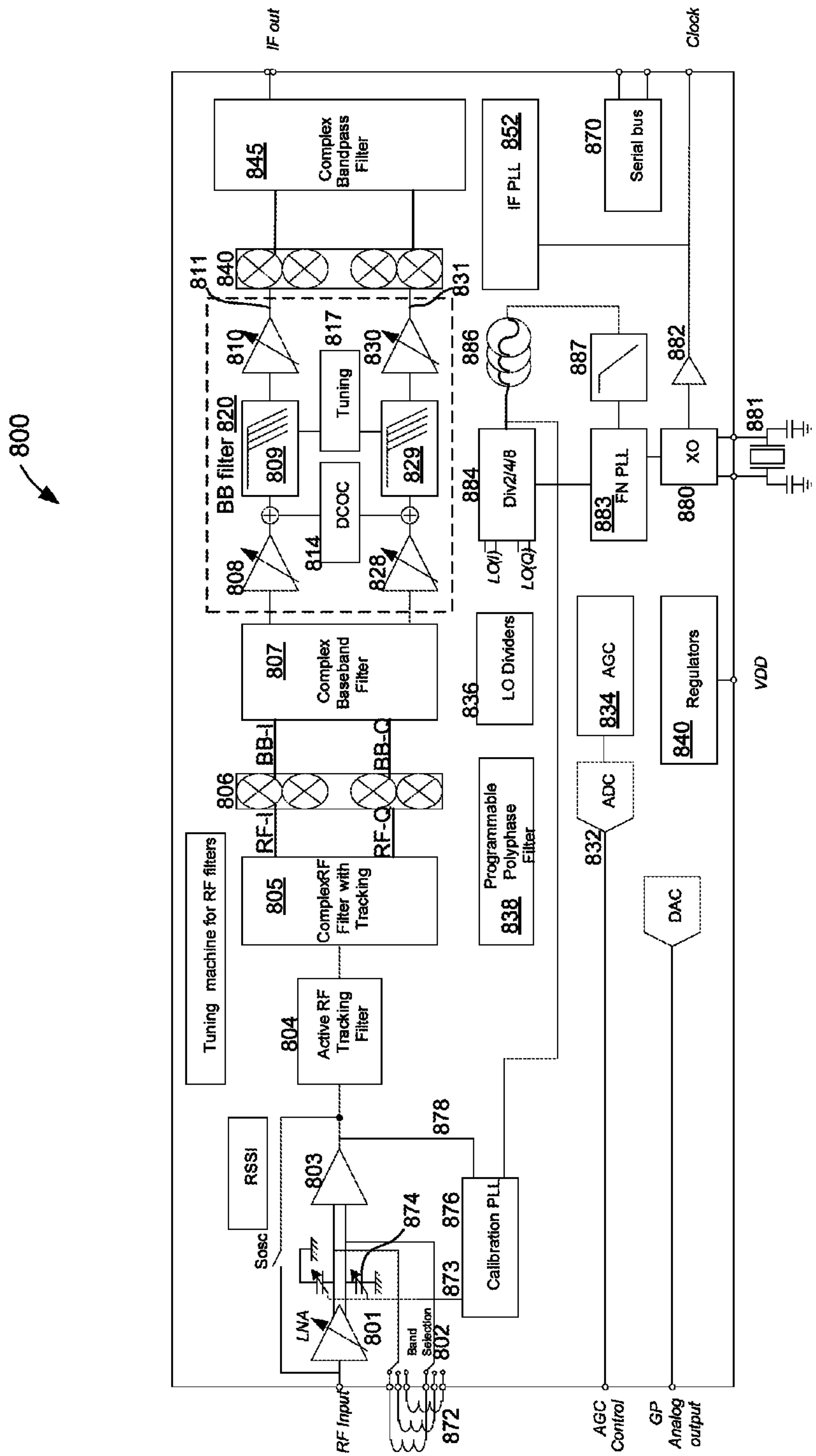
FIG. 8 is a block diagram of a tuner system according to another embodiment of the present invention.

FIG. 8 is a block diagram of a tuner system according to an embodiment of the present invention. As discussed above, the rejection of unwanted channel signals and odd harmonics are the main concern in designing a tuner system. The double-quadrature up-conversion significantly eliminates the third harmonic so that a first-order bandpass filter can be used. In some embodiments of the invention, the double-quadrature conversion circuit will be implemented in the RF front-end portion to further reduce odd harmonics and reject image signals.

Tuner system 800 can be divided into eight stages. The first stage is the RF amplification including a wideband low noise amplifier 801 and a band selection filter 802. The second stage includes an active RF tracking filter 804 that has narrow bandwidth to further reject unwanted signals. The center frequency of the tracking filter can be set o the desired channel frequency. The third stage contains a complex RF filter 805 that operates in the complex domain and can removes negative frequencies. The fourth stage is a double-quadrature down-mixer 806 that frequency down-converts complex RF I and Q signals into respective baseband I and Q signals. Down-mixer or down-converter 806 together with the band selection filter 802 and RF tracking filter 804 provide sufficient rejection of the third and fifth harmonics of the RF signals for applications in TV tuners. The fifth stage may include a complex baseband filter for removing the image band of the tuned channel in the negative frequencies to prevent any negative frequencies from folding into the desired channel due to mismatches in the baseband paths. The sixth stage includes a baseband filter that contains two identical paths for removing adjacent channels. The baseband filter will be described in detail later. The seventh stage includes a double-quadrature up-converter 840, whose function is described above in relation with FIG. 3. The eighth stage includes a complex bandpass filter 845, whose function is described above in relation with FIG. 5.

Although all signals are shown as single lines in the drawings, they are typically differential signals so that even harmonics cancel out, and only odd harmonics remain as a concern in the tuner system.

LNA 801 is a wideband amplifier covering from 44 MHz (i.e., the VHF low band) to 890 MHz (UHF V band). As discussed above, wideband tuners are different from narrow-band RF receivers because the harmonics of the local oscillator will occur in the same band. In order to reject unwanted channel signals and odd-harmonic, LNA 801 is coupled to a band selector filter 802. In an embodiment, band selection filter 802 can be realized using inductors 872 and capacitors 874. Band selector filter 802 is tunable such as that it can be set to have its center frequency at a desired band. Selection band filter 802 can be tuned using on-chip capacitors 274 that are implemental as an array or multiple arrays of capacitors. The array or the multiple arrays of capacitors will tune the center of the selection band filter in conjunction with inductors 272. In one embodiment, inductors 872 are external to the tuner system. The center frequency of band selection filter 802 is the resonance frequency obtained according to the expression $Fc=1/(2\pi\sqrt{LC})$, where L is the value of the inductor 872 and C is the capacitive value of capacitor arrays 874.

In an embodiment, capacitors 874 can be switched with electronic switches in parallel to increase their capacitive value. Electronic switches can easily be implemented using MOS transistors. Capacitors can also be implemented in other well-known ways such as with varactors or a combination of varactors and arrays of capacitors with electronic switches.

As consequence, band selection filter 802 can have tunable center frequency by varying the capacitance value. Band selection filter 802 can further be calibrated using a calibration PLL 876. Calibration PLL 876 generates a test signal 873 that is applied to selection filter 802. A signal 878 is then measured and optimized by adjusting capacitors 874. In an embodiment, the fine tuning of capacitor array 874 can be performed by detecting the difference between the LC resonance frequency and the local oscillation frequency. The detected error between these two frequencies can be used to adjust capacitor array 874 until the error becomes negligible. In an embodiment, the calibration can be automated using a program code running on a host (not shown). The program code controls the calibration PLL 876, adjusts the value of capacitors 874, and measures the signal level 878 at the output of amplifier 803. The program code can be fed to the tuner system 200 through the serial bus 870. In another embodiment, the program code can be stored and operated on a digital memory coupled to a digital control that are integrated on tuner system 800.

The bandwidth of band selection filter 802 can also be adjusted. For example, by narrowing the bandwidth or Q of the band selection filter, higher image rejection of the tuner system can be achieved.

Figure 9:
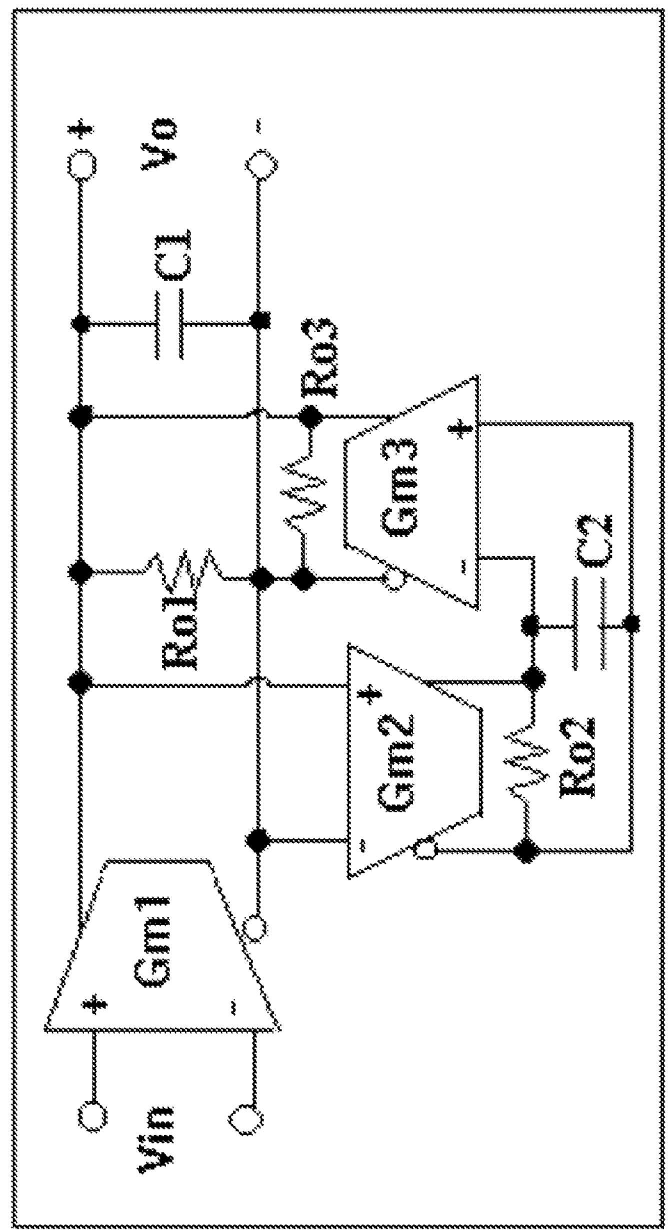
FIG. 9 is a block circuit diagram of an active RF tracking filter according to an embodiment of the present invention.

Active RF tracking filter 804 can further improve the image rejection of band selection filter 802. In an embodiment, RF tracking filter 804 has a tunable center frequency. FIG. 9 is an exemplary block circuit of an active RF tracking filter according to an embodiment of the present invention. Filter 804 is an active second order tracking filter that can cover a wide frequency band and has a narrow bandwidth to achieve sufficient rejection of unwanted signal. The bandwidth can be determined by the resistors; and the center frequency can be determined by the values Gm2, Gm3, C1, and C2. By controlling the value of the resistors, C2, C2, Gm2, and Gm3, the programmability of the filter can be achieved. In an embodiment, all input and output signals to and from RF tracking filter 804 are differential.

Complex RF filter 805 is a complex RF filter with tracking capability. Filter 805 works in the complex domain and is capable of removing negative frequencies. It can track the desired band in a similar way as described for band selection filter 802 and 804. Complex filter 805 receives the real magnitude RF signals from RF tracking filter 804 and produces an in-phase RF signal RF-I and a quadrature RF signal RF-Q. Its architecture can be similar to the polyphase filter in FIG. 4 or complex bandpass filter 845 described above. Its design implementation can be analogous to the filter 845 with electronic circuitry adapted to operate at the desired RF frequency range.

Double-quadrature down-converter 806 receives RF-I and RF-Q signals and frequency down-converts them to the baseband by mixing them with oscillation frequency LO(I) and LO(Q). Local oscillation frequency LO(I) and LO(Q) have a 90 degree phase shift. Double-quadrature down-converter 806 includes four multipliers for implementing a complex multiplication according to the expression (a+jb)*(c+jd)=(a*b−c*d)+j(a*d+b*c), where the term (a*b−c*d) is the in-phase baseband signal BB-I and the term j(a*d+b*c) is the quadrature baseband signal BB-Q.

In an embodiment, local oscillation frequency LO(I) and LO(Q) may pass though a programmable polyphase filter 838 to obtain a more accurate phase shift of 90 degrees and a better amplitude matching. Polyphase filter 838 can be either an active or passive one-stage or multiple-stage polyphase filter having the center frequency located close to the local oscillation frequency.

In-phase and quadrature baseband signals BB-I and BB-Q may apply directly to baseband filter 820, which lets the desired baseband signals pass through, but removes the adjacent channels. In an embodiment, a complex baseband filter 807 may interpose between double-quadrature down-converter 806 and baseband filter 820 to further increase the image rejection. Complex baseband filter 807 may be required to remove the image of the desired channel in the negative frequencies to prevent the image from folding over into the tuned channel due to mismatches in the baseband signals.

Baseband filter 820 comprises programmable lowpass filters 809, 829 that are interposed between a set of amplifiers 808, 828 and 810 and 830. The cutoff frequency (i.e., the bandwidth) of lowpass filters 809 and 829 is programmable to accommodate different TV systems. For example, the digital TV channel is centered at DC, so that the bandwidth of filters 809 and 829 is half of the channel bandwidth. Since the analog TV channel is above DC, the bandwidth or cut-off frequency of the filters 809 and 829 must be programmed to be equal to full bandwidth of the desired channel. DC offset cancellation block 214 removes any DC component that may exits at the inputs of filters 809 and 829.

Double-quadrature up-converter 840 receives filtered baseband signals 811 and 831 and frequency up-converts them to an IF frequency by mixing them with two IF frequencies IF(I) and IF(Q). Double-quadrature up-converter 840 includes four IF multipliers whose functions are described above in relation with FIG. 3. IF(I) and IF(Q) can be generated directly by a IF PLL 852, which can be a conventional integer or a fractional N phase locked loop.

Tuner system 800 further includes a fractional N PLL 883 that receives a reference frequency from a crystal oscillator 880. Fractional N PLL 883 generates a local oscillator frequency that is used to down-convert the RF signals RF-I and RF-Q to baseband signals BB-I and BB-Q. The 90-degree phase shift of the local oscillation frequency can be realized using polyphase filter 838.

In an embodiment, tuner system 800 may be a silicon tuner that includes a serial digital bus interface 870 for communication with an external baseband processor. Serial bus interface 870 may contain digital control and configuration registers to program the IF frequency of IF PLL 852 and fractional N PLL 883.

Figure 10:
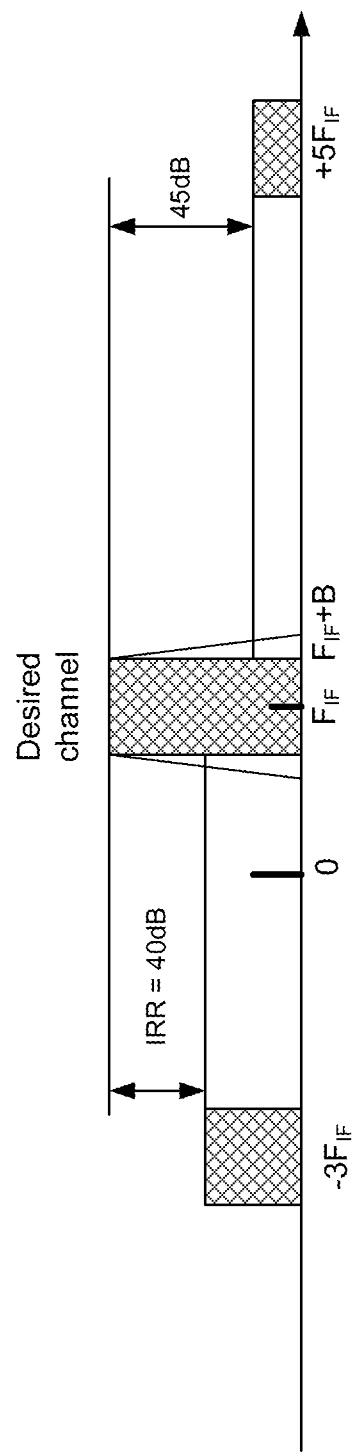
FIG. 10 is a frequency plan illustrating a desired IF signal and images at the output of the double-quadrature up-converter according to an embodiment of the present invention.

FIG. 10 is a frequency plan illustrating a desired signal level and images at the output of the last two stages that comprises double-quadrature up-converter 840 and polyphase filter 845 as shown in FIG. 7. A metric to quantify the degree of image rejection is the image rejection ratio (IRR). IRR of a receiver device is defined by the ratio between the level of the desired signal divided by the level of an image signal. In an embodiment of the invention, the IF is set to 36 MHz and the signal bandwidth is set to 4 MHz. Note that the bandwidth is defined as the −3 dB cutoff frequency of a first-order analog lowpass filter; and the actual bandwidth is twice as large because the negative frequency portion of the first-order lowpass filter bandwidth is shifted to the IF frequency. In an embodiment, the double quadrature up-converter provides a rejection of 3× and the polyphase filter provides a rejection of 36× for a total of about 40 dB 1 RR for the negative third IF harmonic. And the double quadrature up-converter provides a rejection of 5× and the polyphase filter provides a rejection gain of 36× for a total of about 45 dB IRR for the positive fifth IF harmonic. The positive third harmonic does not exist in the shown frequency plan. Thus, the desired channel at the IF frequency can be filtered using a simple first-order bandpass filter according to an embodiment of the present invention.

While the advantages and embodiments of the present invention have been depicted and described, there are many more possible embodiments, applications and advantages without deviating from the spirit of the inventive ideas described herein. It will be apparent to those skilled in the art that many modifications and variations in construction and widely differing embodiments and applications of the present invention will suggest themselves without departing from the spirit and scope of the invention. Thus, the disclosure is not intended to be limited to the embodiments shown herein but is to be accorded the widest scope consistent with the novel features disclosed herein.

What is claimed is:

1. A tuner system for radio frequency (RF) reception comprising:

a low noise amplifier for receiving an RF signal, the low noise amplifier being configured to output an amplified RF signal, the amplified RF signal including a plurality of bands;

a band selection filter having a plurality of inductors and configured to select one of the plurality of bands;

a complex RF filter configured to generate a complex RF signal from the selected one of the plurality of bands for removing negative frequencies of the selected one of the plurality of bands;

a down-converter configured to:

receive the complex RF signal, mix the complex RF signal with a first local oscillation frequency and a second local oscillation frequency, and output a baseband in-phase signal and a baseband quadrature signal;

a baseband filter having at least two substantially equal lowpass frequency responses and configured to filter the baseband in-phase signal and the baseband quadrature signal;

an up-converter configured to:

receive the filtered baseband in-phase signal and the filtered baseband quadrature signal, frequency up-convert the filtered baseband in-phase signal to an intermediate frequency IF-I signal, and frequency up-convert the filtered quadrature signal to an intermediate frequency IF-Q signal; and a filter coupled to the up-converter configured to receive the frequency up-converted in-phase signal and the frequency up-converted quadrature signal and output an IF signal, wherein the first and second local oscillation frequencies are shifted by 90 degrees, and wherein the IF-I and IF-Q signals have an IF center frequency and an IF bandwidth.

2. The tuner system of claim 1 wherein the low noise amplifier and the band selection filter form a tunable low noise amplifier that provides both a selectable gain and a selectable frequency band.

3. The tuner system of claim 2 wherein the tunable low noise amplifier comprises a coarse-tuning by selecting one of the plurality of inductors and a fine-tuning by digitally varying a capacitive value of a capacitor array.

4. The tuner system of claim 3 wherein the fine tuning comprises a comparison between a LC resonance frequency and a local oscillator frequency.

5. The tuner system of claim 1 further comprises an RF tracking filter having an input connected to an output of the band selection filter and an output connected to the complex RF filter, wherein the RF tracking filter increases a rejection of a third harmonic of the selected one of the plurality of bands.

6. The tuner system of claim 1 wherein the complex RF signal comprises an in-phase component and a quadrature component.

7. The tuner system of claim 1 wherein the down-converter is a double-quadrature down-converter comprises four high frequency multipliers, each of the four multipliers includes a first input coupled to the in-phase component or the quadrature component and a second input coupled to either the first local frequency or the second local frequency so that four multiplication products are obtained.

8. The tuner system of claim 7 wherein the double-quadrature down-converter further comprises an adder and a subtracter, the adder adds a first two of the four products to generate the baseband in-phase signal and the subtracter subtracts a second two of the four products to generate the baseband quadrature signal.

9. The tuner system of claim 1 wherein the baseband filter comprises a programmable bandwidth for accommodating different TV systems.

10. The tuner system of claim 1 further comprising:

an intermediate frequency (IF) oscillator configured to generate a first IF signal and a second IF signal, wherein the first and second IF signals are shifted by 90 degrees.

11. The tuner system of claim 1 wherein the up-converter is a double-quadrature up-converter comprises four IF multipliers.

12. The tuner system of claim 1 wherein the filter is a complex bandpass filter having a programmable frequency center and a programmable bandwidth.

13. The tuner system of claim 12 wherein the complex bandpass filter comprises a first RC active lowpass filter and a second RC lowpass filter, wherein the first and second RC lowpass filters are cross-coupled using resistive elements and electronic switches.

14. The tuner system of claim 12 wherein the programmable frequency center is programmed by changing the value of the resistive elements.

15. The tuner system of claim 12 wherein the programmable bandwidth is programmed by changing either the value of R or C, or both.

16. The tuner system of claim 1 wherein the IF signal is either a complex IF signal or a real lowpass signal.

17. The tuner system of claim 1 further comprising:

a fractional N PLL configured to generate a local oscillation frequency; and a programmable polyphase filter configured to receive the local oscillation frequency and generate the first and second local oscillation frequencies.

18. A method of processing an RF signal in a wideband RF receiver system that receives a plurality of frequency bands, the method comprising:

selecting a band from the plurality of bands;

generating a complex RF signal from the selected band, the complex RF signal generated by filtering the selected band to remove negative frequencies from the selected band;

frequency down-shifting the complex RF signal to generate a complex baseband signal;

lowpass filtering the complex baseband signal;

frequency up-shifting the lowpass filtered complex baseband signal to generate a complex IF signal; and bandpass filtering the complex IF signal.

19. The method of claim 18 wherein the selecting a band comprises:

selecting a band inductor which forms a resonance frequency with a programmable capacitor array having a plurality of capacitors;

fine-tuning the resonance frequency by comparing the resonance frequency with a local oscillator frequency; and varying a capacitance value of the programmable capacitor array.

20. A Radio Frequency (RF) processor for processing an RF signal, the processor configured to:

receive a plurality of frequency bands;

select a band from the plurality of bands;

generate a complex RF signal from the selected band, the complex RF signal generated by filtering the selected band to remove negative frequencies from the selected band;

frequency down-shift the complex RF signal to generate a complex baseband signal;

lowpass filter the complex baseband signal;

frequency up-shift the lowpass filtered complex baseband signal to generate a complex IF signal; and bandpass filter the complex IF signal.

* * * * *